(12) United States Patent
Lo et al.

(10) Patent No.: US 10,390,440 B1
(45) Date of Patent: Aug. 20, 2019

(54) SOLDERLESS INTER-COMPONENT JOINTS

(71) Applicant: NXP B.V., Eindhoven (NL)

(72) Inventors: Tsung Nan Lo, Kaohsiung (TW);
Chung Hsiung Ho, Kaohsiung (TW)

(73) Assignee: NXP B.V., San Jose, CA (US)

( * ) Notice: Subject to any disclaimer, the term of this patent is extended or adjusted under 35 U.S.C. 154(b) by 50 days.

(21) Appl. No.: 15/886,820

(22) Filed: Feb. 1, 2018

(51) Int. Cl.
| B23K 20/00 | (2006.01) |
| H05K 3/34 | (2006.01) |
| H05K 1/11 | (2006.01) |
| H01L 23/00 | (2006.01) |
| H01L 23/498 | (2006.01) |

(Continued)

(52) U.S. Cl.
CPC ............ *H05K 3/3421* (2013.01); *B23K 20/02* (2013.01); *H01L 23/49816* (2013.01); *H01L 24/03* (2013.01); *H01L 24/05* (2013.01); *H01L 24/11* (2013.01); *H01L 24/13* (2013.01); *H01L 24/16* (2013.01); *H01L 24/81* (2013.01); *H05K 1/111* (2013.01); *B23K 2101/36* (2018.08); *H05K 2201/10636* (2013.01); *H05K 2201/10689* (2013.01)

(58) Field of Classification Search
CPC .......... B23K 1/0016; B23K 20/02–028; B23K 20/001; B23K 20/04; B23K 2101/36–42; H05K 3/3421; H05K 1/111; H05K 2201/10636; H05K 2201/10689; H01L 24/13; H01L 23/49816; H01L 24/81; H01L 24/16; H01L 24/11; H01L 24/05; H01L 24/03
USPC .................. 228/179.1–180.22, 193
See application file for complete search history.

(56) References Cited

U.S. PATENT DOCUMENTS 3,560,172 A * 2/1971 Kench et al. ............ B23K 1/19
428/593
5,172,852 A 12/1992 Bernardoni et al.
(Continued)

FOREIGN PATENT DOCUMENTS

FR       2947481 A1 *  1/2011   ......... B81C 1/00269

OTHER PUBLICATIONS

Paras M. Agrawal Betsy M. Rice, Donald L. Thompson, "Predicting Trends in Rate Parameters for self-diffusion on FCC Metal Surfaces", Surf. Sci. 515, 21-35, 2002.
(Continued)

*Primary Examiner* — Kiley S Stoner
(74) *Attorney, Agent, or Firm* — Charles E. Bergere

(57) ABSTRACT

In a die-substrate assembly, a copper inter-component joint is formed by bonding corresponding copper interconnect structures together directly, without using solder. The copper interconnect structures have distal layers of (111) crystalline copper that enable them to bond together at a relatively low temperature (e.g., below 300° C.) compared to the relatively high melting point (about 1085° C.) for the bulk copper of the rest of the interconnect structures. By avoiding the use of solder, the resulting inter-component joint will not suffer from the adverse IMC/EM effects of conventional, solder-based joints. The distal surfaces of the interconnect structures may be curved (e.g., one concave and the other convex) to facilitate mating the two structures and improve the reliability of the physical contact between the two interconnect structures. The bonding may be achieved using directed microwave radiation and microwave-sensitive flux, instead of uniform heating.

15 Claims, 3 Drawing Sheets

(51) Int. Cl.
*B23K 20/02* (2006.01)
*B23K 101/36* (2006.01)

(56) References Cited

U.S. PATENT DOCUMENTS

| | | | |
|---|---|---|---|
| 5,709,336 A | 1/1998 | Ingraham et al. | |
| 5,767,580 A * | 6/1998 | Rostoker | H01L 23/49811 257/737 |
| 5,926,694 A | 7/1999 | Chigawa et al. | |
| 6,019,856 A * | 2/2000 | Born | B23K 35/3605 148/26 |
| 6,137,184 A | 10/2000 | Ikegami | |
| 6,326,241 B1 | 12/2001 | Belke, Jr. et al. | |
| 6,644,536 B2 | 11/2003 | Ratificar et al. | |
| 6,869,871 B1 * | 3/2005 | Choi | H01L 21/28556 257/E21.17 |
| 8,241,963 B2 | 8/2012 | Shen et al. | |
| 8,803,333 B2 | 8/2014 | Yu et al. | |
| 8,922,009 B2 | 12/2014 | Kim et al. | |
| 9,055,703 B2 * | 6/2015 | Farooq | H05K 3/423 |
| 9,425,174 B1 | 8/2016 | Hin et al. | |
| 2003/0102359 A1 * | 6/2003 | Seseke-Koyro | B23K 35/3605 228/223 |
| 2003/0146518 A1 * | 8/2003 | Hikita | H01L 23/3128 257/777 |
| 2005/0035453 A1 | 2/2005 | Ho et al. | |
| 2008/0075853 A1 * | 3/2008 | Barth | C03C 17/347 427/248.1 |
| 2011/0000232 A1 * | 1/2011 | Yamazaki | H01L 21/67201 62/63 |
| 2012/0100657 A1 * | 4/2012 | Di Cioccio | B81C 1/00269 438/51 |
| 2013/0071686 A1 * | 3/2013 | Oda | B32B 15/017 428/652 |
| 2014/0335368 A1 * | 11/2014 | Faruque | B62D 29/008 428/594 |
| 2015/0237729 A1 * | 8/2015 | Brunschwiler | H05K 1/0206 174/255 |
| 2017/0025377 A1 * | 1/2017 | Gondcharton | H01L 25/0657 |
| 2017/0268123 A1 * | 9/2017 | Hwang | C30B 25/08 |

OTHER PUBLICATIONS

Chih Chen, et al., "Low-temperature and low-pressure direct copper-to-copper bonding by highly (111)-oriented nanotwinned Cu", Pan Pacific Microelectronics Symposium (Pan Pacific), 2016.

* cited by examiner

100

100

100

200

200

200

200

300

SOLDERLESS INTER-COMPONENT JOINTS

BACKGROUND

The present invention relates generally to electrically connecting two electronic components, and, more particularly, to techniques for directly interconnecting copper pillars and copper bumps.

FIGS. 1A-1C are cross-sectional side views illustrating a conventional technique forming a die-substrate assembly 100 that includes a flip-chip integrated circuit (IC) die 110 having a copper (Cu) pillar bump 112 to a substrate 120 having a Cu pad 122. FIG. 1A shows the assembly 100 before a solder reflow step is performed, FIG. 1B illustrates the solder reflow step, and FIG. 1C shows the assembly 100 after the solder reflow step. Solder 130 is applied to one of the interconnect structures, in this case, the die's pillar bump 112, and flux 140 is applied to remove existing Cu oxide during the solder reflow step.

The solder reflow step involves uniform heating of the entire assembly 100 using, for example, conductive heating plates (not shown in FIG. 1B) and/or convective thermal wind to a temperature high enough to melt the solder 130. As shown in FIG. 1C, after cooling, the reflowed solder 130 forms both an electrical connection and a mechanical connection between the two Cu interconnect structures 112 and 122 to produce an inter-component joint 150.

It is known to use solder made of a metal, such as tin, having a melting point that is sufficiently low (e.g., below 300° C.) compared to the relatively high melting point (about 1085° C.) of the bulk copper used to form the interconnect structures 112 and 122 in order to prevent permanent damage to the die 110 and the substrate 120 from the heating applied during the solder reflow step.

Unfortunately, because the solder is made of a metal different from the copper of the interconnect structures 112 and 122, the resulting joint 150 can suffer from adverse intermetallic compound (IMC) effects that can affect the flow of current across the Cu—Sn interfaces of the joint 150. In addition, high current density can induce electro-migration (EM) where electrons can drive the Cu to diffuse into the solder, thereby increasing the adverse IMC effects.

Accordingly, it would be advantageous to have a way to interconnect such components where a connection joint therebetween does not suffer or suffers less from IMC and EM issues.

BRIEF DESCRIPTION OF THE DRAWINGS

Embodiments of the invention will become more fully apparent from the following detailed description, the appended claims, and the accompanying drawings in which like reference numerals identify similar or identical elements.

DETAILED DESCRIPTION

Figure 1A:
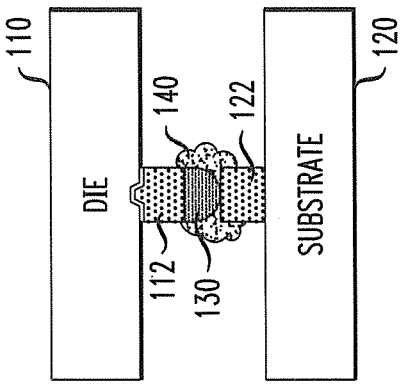
FIGS. 1A-1C are cross-sectional side views illustrating a conventional technique for connecting a flip-chip IC die to a substrate to form a conventional die-substrate assembly.
Figure 1B:
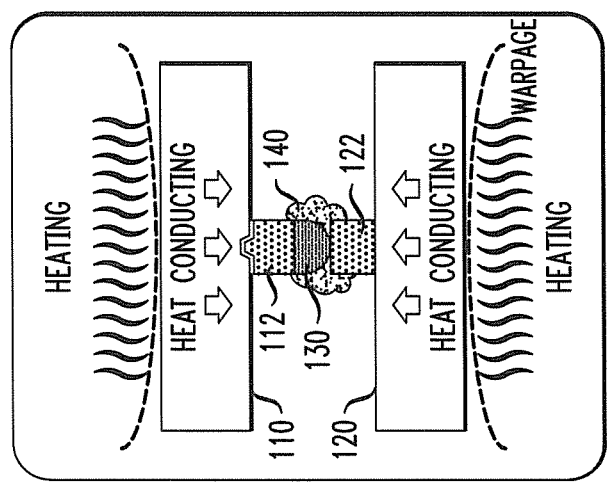
Figure 1C:
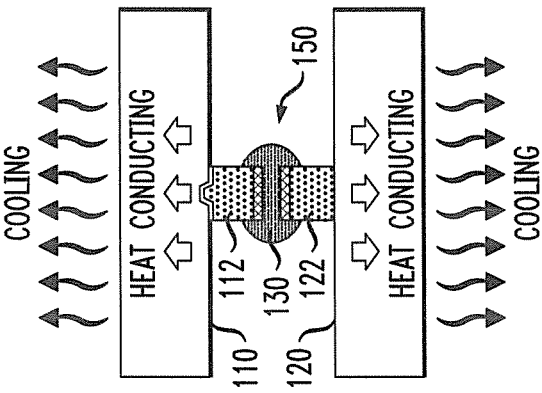

Detailed illustrative embodiments of the invention are disclosed herein. However, specific structural and functional details disclosed herein are merely representative for purposes of describing example embodiments of the invention. The invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, the present invention provides a method for assembling an article of manufacture, such as an integrated circuit die mounted to a substrate. The method includes providing first and second electronic components, and mating the first and second electronic components. The first electronic component comprises a first metal interconnect structure having a distal layer of crystalline metal, and the second electronic component comprises a second metal interconnect structure having a distal layer of crystalline metal. During the mating, the distal layer of the first metal interconnect structure contacts the distal layer of the second metal interconnect structure. Heat then is applied to bond the first and second metal interconnect structures together to form a metal inter-component joint. In one embodiment, the first and second metal interconnect structures are copper interconnect structures, and the distal layers of crystalline metal are (111) copper.

The first and second metal interconnect structures are bonded together by metal diffusion, without using any solder. In one embodiment, one of the first and second metal interconnect structures has a concave distal surface, and the other of the first and second metal interconnect structures has a convex distal surface that mates with the concave distal surface.

In another embodiment, the present invention provides an article of manufacture comprising a first electronic component, such as a flip-chip die, mounted onto a second electronic component, such as a substrate or PCB (Printed Circuit Board). The first electronic component has a first metal interconnect structure bonded to a second metal interconnect structure of the second electronic component without any intervening solder. The first and second metal interconnect structures are copper interconnect structures having respective distal layers of crystalline metal that are (111) copper formed by electroplating the first and second metal interconnect structures. In one embodiment, one of the first and second metal interconnect structures has a concave distal surface, and the other of the first and second metal interconnect structures has a convex distal surface, where the radius of the concave distal surface is greater than the radius of the convex distal surface.

Referring now to FIGS. 2A-2D, cross-sectional side views illustrating a method of forming a die-substrate assembly 200 by connecting a flip-chip IC die 210 having a Cu pillar bump 212 to a substrate 220 having a Cu pad 222. That is, connecting the pillar bump 212 to the pad 222. FIG.

Figure 2A:
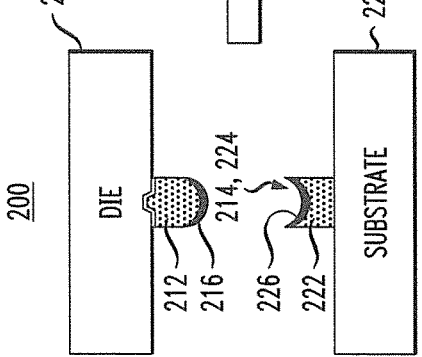
FIGS. 2A-2D are cross-sectional side views illustrating a technique for connecting a flip-chip IC die to a substrate to form a die-substrate assembly in accordance with embodiments of the present invention.
Figure 2B:
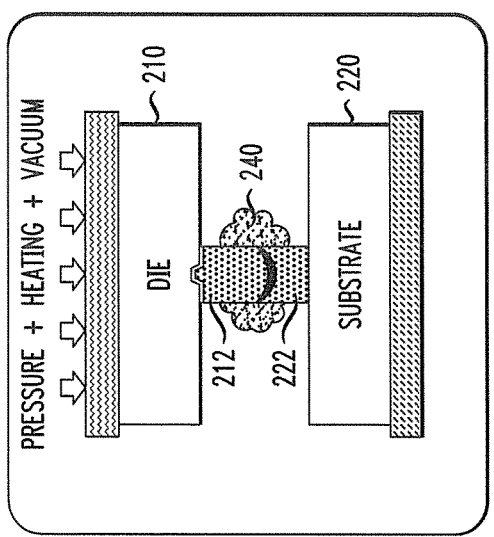
Figure 2C:
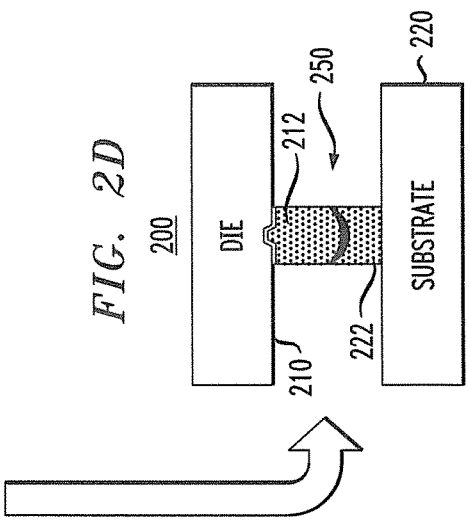
Figure 2D:
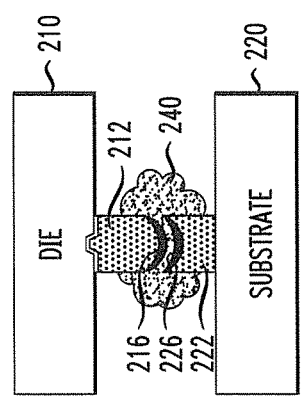

2A shows the assembly 200 before the die 210 is mated to the substrate 220, FIG. 2B shows the assembly 200 after the die 210 is mated to the substrate 220, but before a bonding step is performed, FIG. 2C shows the assembly 200 while the bonding step is being performed, and FIG. 2D shows the assembly 200 after the bonding step has been performed.

The die 210 and the substrate 220 both have respective copper (Cu) interconnect structures, i.e., the pillar bump 212 and the pad 222. In the presently preferred embodiment, the pillar bump 212 has a convex distal surface 214, and the substrate pad 222 has a corresponding concave distal surface 224. The convex distal surface 214 of the pillar bump 212 may be achieved using plating electrolytes and parameter control, and the concave distal surface 224 of the pad 222 may be achieved using a typical foundation design of a passivation layer opening for connecting pad exposure. In alternative implementations, other suitable techniques may be used to achieve the desired shapes.

The distal surfaces 214 and 224 of the two copper interconnect structures 212 and 222 have respective applied layers 216 and 226 of (111) crystalline copper, which is different from the bulk copper of the rest of the interconnect structures 212 and 222. The (111) crystalline copper layers 216 and 226 may be applied using electroplating or sputtering, although other suitable techniques may also be employed.

In a one possible implementation, the interconnect structures 212 and 222 are about 40-100 microns high, the crystalline layers 216 and 226 are about 15-20 microns thick, the convex distal surface 214 of the pillar bump 212 is about 5-10 microns high and has a radius of curvature of about 120 microns, and the concave distal surface 224 of the substrate pad 222 is about 5-10 microns deep and has a radius of curvature of about 120 microns.

In the example embodiment shown in FIGS. 2A-2D, the convex shape of the pillar bump 212 conforms to the concave shape of the substrate pad 222, such that the radii of curvature of the two distal surfaces are substantially equal and the diameters of the interconnect structures 212 and 222 are substantially equal. In certain implementations, in order to improve the reliability of the physical contact between the two interconnect structures 212 and 222, (i) the radius of curvature of the convex distal surface 214 of the pillar bump 212 is smaller than the radius of curvature of the concave distal surface 224 of the pad 222 and/or (ii) the pad 222 with the concave distal surface 224 is wider than the pillar bump 212 with the convex distal surface 214. It will be understood by those of skill in the art that in alternative embodiments, the pillar bump can have a concave distal surface and the substrate pad can have a convex distal surface.

FIG. 2B shows the die 210 being mated to the substrate 220 with the copper interconnect structures 212 and 222 using flux 240. That is, the copper interconnect structures 212 and 222 are in direct contact and are mated without using any intervening solder.

Referring to FIG. 2C, during the bonding step, uniform heating, compressive force, and vacuum are applied during which the (111) crystalline copper layers 216 and 226 bond together by Cu-to-Cu diffusion. It should be noted that the bonding step involves uniform heating of the entire die-substrate assembly 200. The crystalline copper layers 216 and 226 are able to bond together at a relatively low temperature (e.g., below 300° C.) compared to the relatively high melting point (about 1085° C.) of the bulk copper used to form the rest of the interconnect structures 212 and 222 in order to prevent permanent damage to the die 210 and the substrate 220 from the uniform heating applied during the bonding step. In one embodiment, a temperature of about 280° C., a compressive force of about 100 psi, and a vacuum of about $10^{-3}$ torr are applied for about 30 minutes. Note that the high temperature (over 1000° C.) required to bond the bulk copper interconnect structures 212 and 222 together without the presence of the (111) crystalline copper layers 216 and 226 would risk damaging the die 210 and the substrate 220.

FIG. 2D shows the two Cu interconnect structures 212 and 222 bonded together, after cooling, to produce an inter-component joint 250 that forms both an electrical connection and a mechanical connection between the die 210 and the substrate 220. Because the resulting inter-component joint 250 is made entirely of copper, there are no adverse IMC effects. Moreover, because no solder is used, there are no adverse EM-induced IMC effects.

Figure 3:
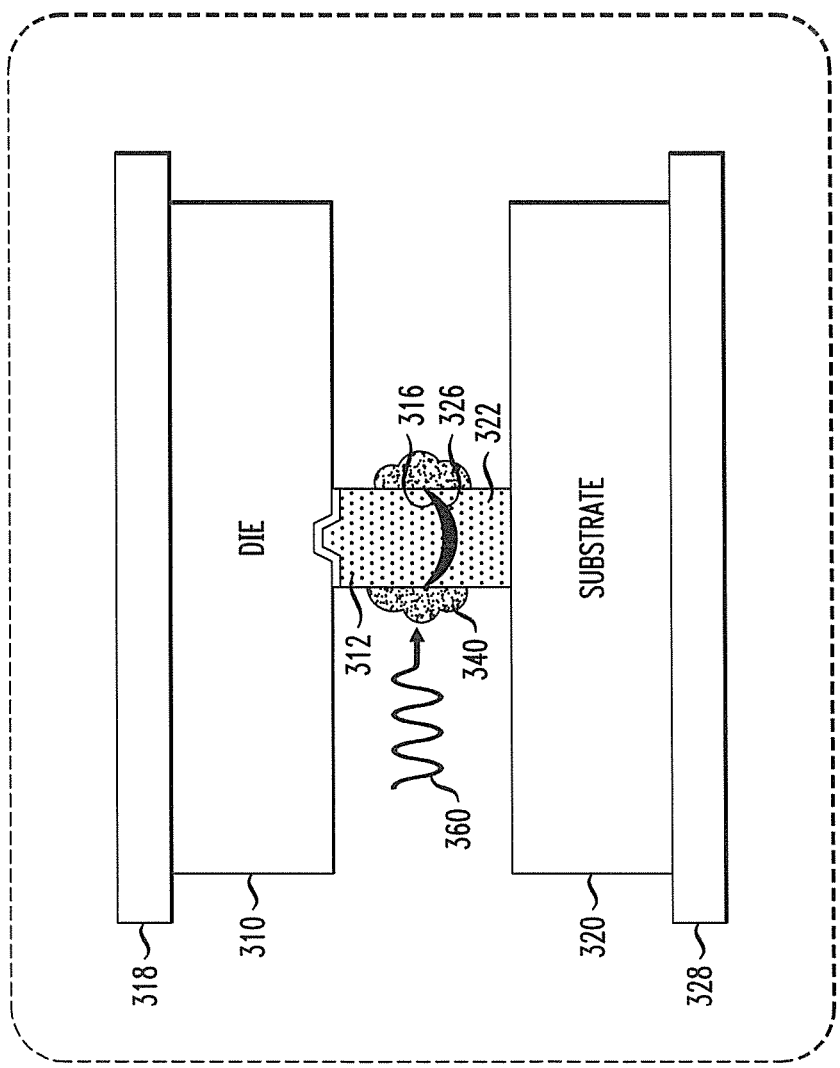
FIG. 3 is a cross-sectional side view of an alternative bonding step, involving localized heating, in accordance with an embodiment of the present invention.

FIG. 3 is a cross-sectional side view of an alternative bonding step involving localized heating, where similar elements have labels similar to those in FIGS. 2A-2D, i.e., die 310, pillar bump 312, substrate 320, substrate pad 322, crystalline copper layers 316 and 326, and flux 340. In this embodiment, the flux 340 is a microwave-sensitive flux, and the bonding step involves localized heating of the interconnect structure interface between the (111) crystalline copper layers 316 and 326 by directing microwave radiation 360 as a directed beam from a targeted microwave beam device (not shown) towards the microwave-sensitive flux 340. The microwave radiation 360 heats up the flux 340, which in turn transfers heat conductively to the crystalline copper layers 316 and 326 not only to remove Cu oxide but also to cause the copper layers 316 and 326 to bond together in the presence of compressive force and vacuum. In some implementations, the microwave radiation is pulsed (i.e., turned on and off with a specified duty cycle and frequency) over the duration of the bonding step.

Further, instead of using conductive hot plates to achieve uniform heating of the die-substrate assembly 300, respective conductive cooling plates 318 and 328 are applied to the die 310 and the substrate 320 to prevent them from overheating during the localized heating of the bonding step. In one implementation, the crystalline copper layers 316 and 326 are heated to about 260° C., while the temperatures of the die 310 and the substrate 320 are maintained at about 20° C., thereby inhibiting permanent damage to the die 310 and the substrate 320, e.g., due to thermal warpage.

Although the invention has been described in the context of a flip-chip IC die having a pillar bump being mounted onto a substrate having a pad, in general, the invention can be implemented in the context of the electrical and mechanical connection of any two suitable electronic components having any suitable interconnect structures.

Although the invention has been described in the context of joints made of two corresponding copper interconnect structures, in general, the invention can be implemented for interconnect structures made of any suitable metal.

Although the invention has been described in the context of a single interconnect structure on a die and a corresponding, single interconnect structure on a substrate to form a single inter-component joint, it will be understood that typical assemblies of dies and substrates will have multiple instances of such inter-component joints.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. A method for assembling an article of manufacture, the method comprising:
   providing a first electronic component comprising a first metal interconnect structure having a distal layer of crystalline metal;
   providing a second electronic component comprising a second metal interconnect structure having a distal layer of crystalline metal;
   mating the first and second electronic components such that the distal layer of the first metal interconnect structure contacts the distal layer of the second metal interconnect structure;
   applying flux to at least one of the first and second metal interconnect structures, wherein the flux is microwave-sensitive; and
   applying heat to bond the first and second metal interconnect structures together to form a metal inter-component joint, wherein the flux is heated using microwave radiation and heat from the flux conductively heats the distal layers of crystalline metal.

2. The method of claim 1, wherein the first and second metal interconnect structures are copper interconnect structures, and the distal layers of crystalline metal are (111) copper.

3. The method of claim 1, wherein the distal layers of crystalline metal are formed by electroplating the first and second metal interconnect structures.

4. The method of claim 1, wherein the first and second metal interconnect structures are bonded together without using any solder.

5. The method of claim 1, wherein the first and second metal interconnect structures are bonded together by metal diffusion.

6. The method of claim 1, wherein the microwave radiation is applied as a directed beam from a targeted microwave beam device.

7. The method of claim 1, wherein the microwave radiation is pulsed to apply the heat.

8. The method of claim 1, wherein respective cooling plates are applied to the first and second electronic components to inhibit permanent damage to the first and second electronic components.

9. The method of claim 1, wherein:
   one of the first and second metal interconnect structures has a concave distal surface; and
   the other of the first and second metal interconnect structures has a convex distal surface.

10. The method of claim 9, wherein the radius of the concave distal surface is greater than the radius of the convex distal surface.

11. The method of claim 9, wherein:
   the concave distal surface is formed using a foundation design; and
   the convex distal surface is formed using a plating solution.

12. The method of claim 1, wherein the distal layers of crystalline metal are heated to less than 300° C.

13. The method of claim 1, wherein a compressive force is applied between the first and second electronic components when the heat is applied.

14. The method of claim 1, wherein a vacuum is applied when the heat is applied.

15. The method of claim 1, wherein:
   the first electronic component is a flip-chip die; and
   the second electronic component is a substrate.

* * * * *